United States Patent
Ma et al.

(10) Patent No.: US 6,297,539 B1
(45) Date of Patent: Oct. 2, 2001

(54) DOPED ZIRCONIA, OR ZIRCONIA-LIKE, DIELECTRIC FILM TRANSISTOR STRUCTURE AND DEPOSITION METHOD FOR SAME

(75) Inventors: Yanjun Ma, Vancouver; Yoshi Ono, Camas, both of WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/611,356

(22) Filed: Jul. 6, 2000

Related U.S. Application Data

(60) Continuation-in-part of application No. 09/515,743, filed on Feb. 29, 2000, which is a division of application No. 09/356,470, filed on Jul. 19, 1999, now Pat. No. 6,060,755.

(51) Int. Cl.$^7$ ........................... H01L 29/76; H01L 29/94; H01L 31/062; H01L 31/113; H01L 31/119

(52) U.S. Cl. ..................... 257/410; 257/411; 438/591; 438/785

(58) Field of Search ..................... 257/410, 411, 257/406, 288, 40, 632; 438/785, 778, 783, 591

(56) References Cited

U.S. PATENT DOCUMENTS

| | | | |
|---|---|---|---|
| 6,015,739 | * | 1/2000 | Gardner et al. . |
| 6,060,755 | * | 5/2000 | Ma et al. . |
| 6,165,834 | * | 12/2000 | Agarwal et al. . |
| 6,207,589 | * | 3/2001 | Ma et al. . |

OTHER PUBLICATIONS

Article entitled, "Atomic Layer Deposition for Nanoscale Thin Film Coatings", by B. Pathangey and R. Solanki, published in Vacuum Technology & Coating, May 2000, pp. 33–41.

* cited by examiner

*Primary Examiner*—Sheila V. Clark
(74) *Attorney, Agent, or Firm*—Matthew D. Rabdau; David C. Ripma; Scott C. Krieger

(57) ABSTRACT

A high-k dielectric films is provided, which is doped with divalent or trivalent metals to vary the electron affinity, and consequently the electron and hole barrier height. The high-k dielectric film is a metal oxide of either zirconium (Zr) or hafnium (Hf), doped with a divalent metal, such as calcium (Ca) or strontium (Sr), or a trivalent metal, such as aluminum (Al), scandium (Sc), lanthanum (La), or yttrium (Y). By selecting either a divalent or trivalent doping metal, the electron affinity of the dielectric material can be controlled, while also providing a higher dielectric constant material then silicon dioxide. Preferably, the dielectric material will also be amorphous to reduce leakage caused by grain boundaries. Also provided are sputtering, CVD, Atomic Layer CVD, and evaporation deposition methods for the above-mentioned, doped high dielectric films.

41 Claims, 3 Drawing Sheets

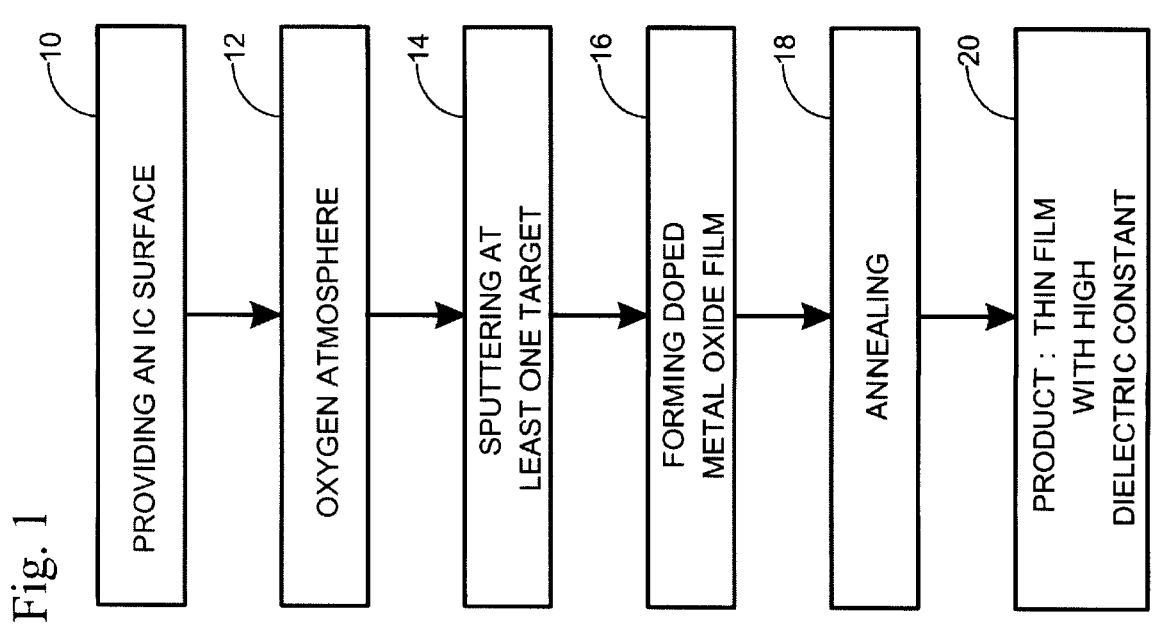

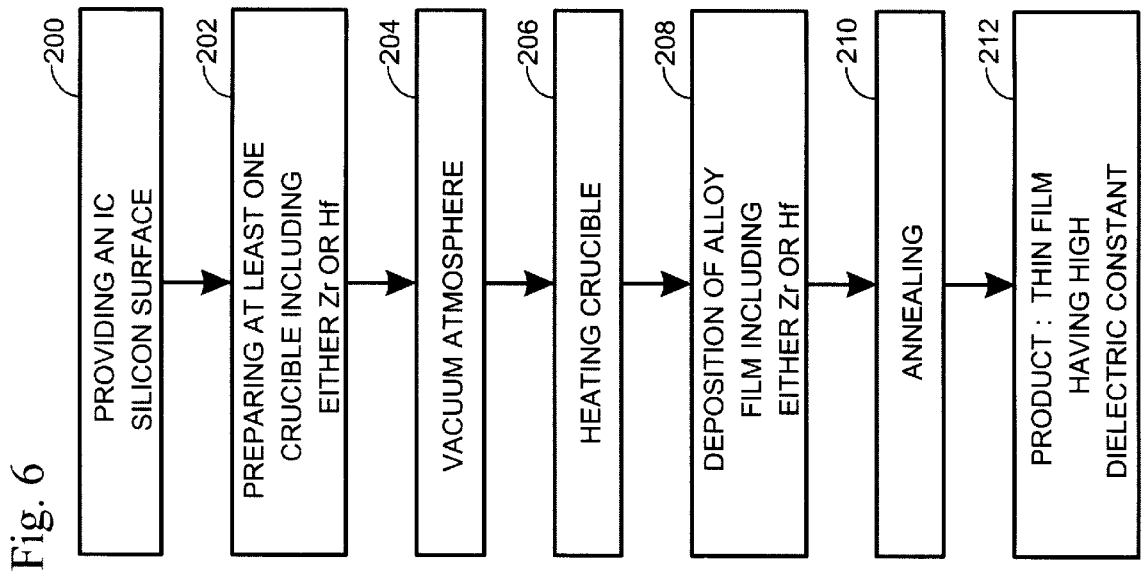
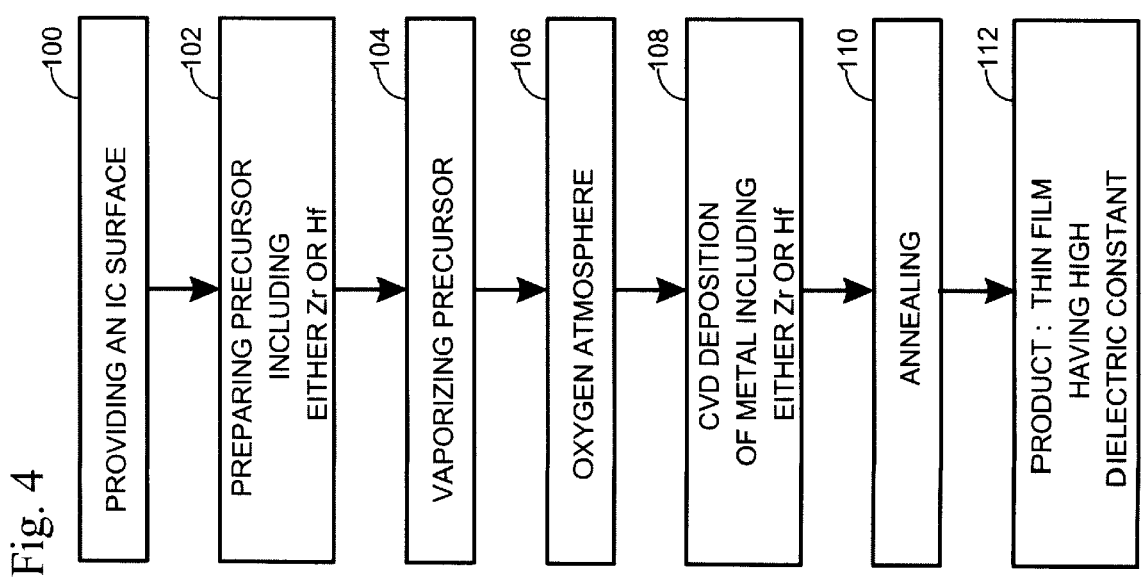

ly be made thicker, thicknessesion of an integrated circuit (IC) fabrication processes and, more particularly, to a high dielectric constant gate insulation film, and a deposition method for such film.

DOPED ZIRCONIA, OR ZIRCONIA-LIKE, DIELECTRIC FILM TRANSISTOR STRUCTURE AND DEPOSITION METHOD FOR SAME

This application is a continuation-in-part of U. S. patent application Ser. No. 09/515,743, filed Feb. 29, 2000, which is a divisional of U.S. patent application Ser. No. 09/356,470, filed Jul. 19, 1999, U.S. Pat. No. 6,060,755.

BACKGROUND OF THE INVENTION

The present invention relates generally to integrated circuit (IC) fabrication processes and, more particularly, to a high dielectric constant gate insulation film, and a deposition method for such film.

Current Si VLSI technology uses $SiO_2$, or nitrogen containing $SiO_2$, as the gate dielectric in MOS devices. As device dimensions continue to scale down, the thickness of the $SiO_2$ layer must also decrease to maintain the same capacitance between the gate and channel regions. Thicknesses of less than 2 nanometers (nm) are expected in the future. However, the occurrence of high tunneling current through such thin layers of $SiO_2$ requires that alternate materials be considered. Materials with high dielectric constants would permit gate dielectric layers to be made thicker, and so alleviate the tunneling current problem. These so-called high-k dielectric films are defined herein as having a high dielectric constant relative to silicon dioxide. Typically, silicon dioxide has a dielectric constant of approximately 4, while high-k films have a dielectric constant of greater than approximately 10. Current high-k candidate materials include titanium oxide ($TiO_2$), zirconium oxide ($ZrO_2$), tantalum oxide ($Ta_2O_5$), and barium and strontium titanium oxide $(Ba,Sr)TiO_3$. One common problem associated with the above-mentioned high-k dielectrics is that they develop a crystalline structure under normal preparation conditions. As a result, the surface of the film is very rough. Surface roughness causes non-uniform electrical fields in the channel region adjacent the dielectric film. Such films are not suitable for the gate dielectrics of MOSFET devices.

Because of high direct tunneling currents, $SiO_2$ films thinner than 1.5 nm cannot be used as the gate dielectric in CMOS devices. There are currently intense efforts in the search for the replacement of $SiO_2$, with $TiO_2$ and $Ta_2O_5$ attracting the greatest attention. However, high temperature post deposition annealing, and the formation of an interfacial $SiO_2$ layer, make achieving equivalent $SiO_2$ thicknesses (EOT) of less than 1.5 nm very difficult.

It would be advantageous if a high-k dielectric film could be used as an insulating barrier between a gate electrode and the underlying channel region in a MOS transistor.

It would be advantageous if improved high-k dielectric materials could be formed by simply doping, or otherwise adding additional elements to currently existing high-k dielectric materials.

It would be advantageous if the electrical properties, including electron affinity, of the high-k dielectric materials could be modified by simply doping, or otherwise adding additional elements to currently existing high-k dielectric materials.

SUMMARY OF THE INVENTION

Accordingly, a thin film having a high dielectric constant (10 to 25) is provided. The film including a doping metal, a metal selected from the group consisting of zirconium (Zr) and hafnium (Hf), and oxygen. The doping metal is preferably a trivalent metal, such as aluminum (Al), scandium (Sc), lanthanum (La), or yttrium (Y), or a divalent metal, such as calcium (Ca) or strontium (Sr).

By selecting the doping metal, it is possible to vary the electron affinity of the dielectric material deposited. By varying the electron affinity it is possible to vary the electron barrier height and the hole barrier height. Accordingly, the present invention allows one to modify the electron affinity of the dielectric film while producing a film with a higher dielectric constant than silicon dioxide. In addition, the presence of the doping metal tends to produce amorphous dielectric materials since the presence of the doping metals reduces, or eliminates, the formation of crystalline structures.

The present invention provides, in part, zirconia ($ZrO^2$) stabilized by $Y_2O_3$, $CaO_2$, $Al_2O_3$, $La_2O_3$, La and Sr. In another embodiment $SrZO_3$ is provided as a dielectric material.

Typically, the percentage of doping metal in the film does not exceed approximately 50%. In some applications the percentage of doping metal will be less than approximately 10%, in which case the film produced may not be amorphous.

Also provided is a MOSFET transistor. The transistor comprising a gate electrode, a channel region having a top surface underlying said gate electrode, and a gate dielectric film interposed between the gate electrode and the channel region top surface. The content of the dielectric film is as described above. Typically, the gate dielectric film has a thickness in the range of approximately 20 and 200 Å.

Some aspects of the invention further comprise the transistor having an interface barrier, with a thickness in the range of approximately 2 to 5 Å, interposed between the channel region and the gate dielectric film. The interface materials are selected from the group consisting of silicon nitride and silicon oxynitride, whereby the channel region top surface is made smoother to prevent the degradation of electron mobility of the MOSFET.

In the fabrication of an integrated circuit (IC) having a surface, a sputtering method is also provided to form a doped metal oxide film on the IC surface. The method comprises the steps of:

a) establishing an atmosphere including oxygen;

b) sputtering at least one target metal including a metal selected from the group consisting of Zr and Hf, and a doping metal, such as Ca, Sr, Al, Sc, La, or Y, on the IC silicon surface;

c) in response to Steps a) and b), forming the doped metal oxide film; and d) annealing at a temperature in the range of approximately 400 and 900 degrees C., whereby a thin film having a high dielectric constant and good insulating properties is formed.

In some aspects of the invention Step a) includes co-sputtering with separate targets including a first target of a metal selected from the group consisting of Zr and Hf, and a second target of the doping metal in an oxidizing atmosphere.

Alternately, a chemical vapor deposition (CVD) method of depositing the doped metal oxide film is provided comprising the steps of:

a) preparing at least one precursor, including a metal selected from the group consisting of Zr and Hf, and a doping metal;

b) vaporizing the precursor;

c) establishing an atmosphere including oxygen;

d) decomposing the precursor on the IC surface to deposit, by chemical vapor deposition (CVD), an alloy film including the metal selected from the group consisting of Zr and Hf, the doping metal, and oxygen; and e) annealing at a temperature in the range of approximately 400 to 900 degrees C., whereby a thin film having a high dielectric constant and good barrier properties is formed.

In another alternative embodiment, atomic layer chemical vapor deposition (ALCVD), which is also known as atomic layer deposition (ALD), is employed as a method of depositing the doped metal oxide film. The ALCVD method comprises the steps of:

a) preparing a first precursor including a metal selected from the group consisting of Zr and Hf;

b) vaporizing the first precursor and exposing the IC surface to the precursor, whereby a layer, preferably a monolayer, of the metal is chemically adsorbed to the surface to deposit, by ALCVD, the layer of metal;

c) preparing an oxygen precursor;

d) vaporizing the oxygen precursor and exposing the IC surface to the oxygen precursor, whereby a layer, preferably a monolayer, of oxygen is chemically adsorbed to the surface to deposit, by ALCVD, the layer of oxygen;

e) preparing a doping metal precursor, which includes a doping metal;

f) vaporizing the doping metal precursor and exposing the IC surface to the doping metal precursor, whereby a layer of the doping metal is chemically adsorbed to the surface to deposit, by ALCVD, the layer of doping metal; and g) annealing at a temperature in the range of approximately 300 to 900 degrees C. to condition the deposited layers, whereby a thin film having a high dielectric constant and good barrier properties is formed.

By repeating the steps as necessary, multiple layers of each material in the dielectric may be deposited, followed by one, or more layers of other constituent elements. So for example, several layers zirconium could be deposited followed by oxygen and then a doping metal. The process could then be repeated until a total thickness of dielectric material is deposited having the desired amount of doping metal in a zirconium oxide dielectric material.

In yet another alternative embodiment, an evaporation deposition method of depositing the doped metal oxide film is provided comprising the steps of:

a) establishing a high vacuum (gas-free) atmosphere, in the range of between approximately $1 \times 10^{-6}$ and $1 \times 10^{-8}$ Torr;

b) preparing at least one crucible including a metal selected from the group consisting of Zr and Hf, and a doping metal;

c) heating the at least one crucible at a temperature in the range of approximately 1000 and 2000 degrees C., to evaporate the metals prepared in Step b);

d) in response to Steps a) through c), depositing an alloy film including the metal selected from the group consisting of Zr and Hf, and the doping metal; and e) annealing in an atmosphere including oxygen at a temperature in the range of approximately 400 to 900 degrees C., to form an alloy film with oxygen, whereby a thin film having a high dielectric constant and good barrier properties is formed.

BRIEF DESCRIPTION OF THE DRAWINGS

FIG. 1 is a flowchart illustrating a sputter deposition method for the doped metal oxide film of the present invention.

FIG. 2 illustrates a step in completing a transistor made using the present invention.

FIG. 3 illustrates a step in completing a transistor made using the present invention.

FIG. 4 is a flowchart illustrating steps in a CVD method of forming a doped metal oxide film of the present invention.

FIG. 6 is a flowchart illustrating steps in an evaporation method of forming a doped metal oxide film.

DETAILED DESCRIPTION OF THE INVENTION

Figure 5:
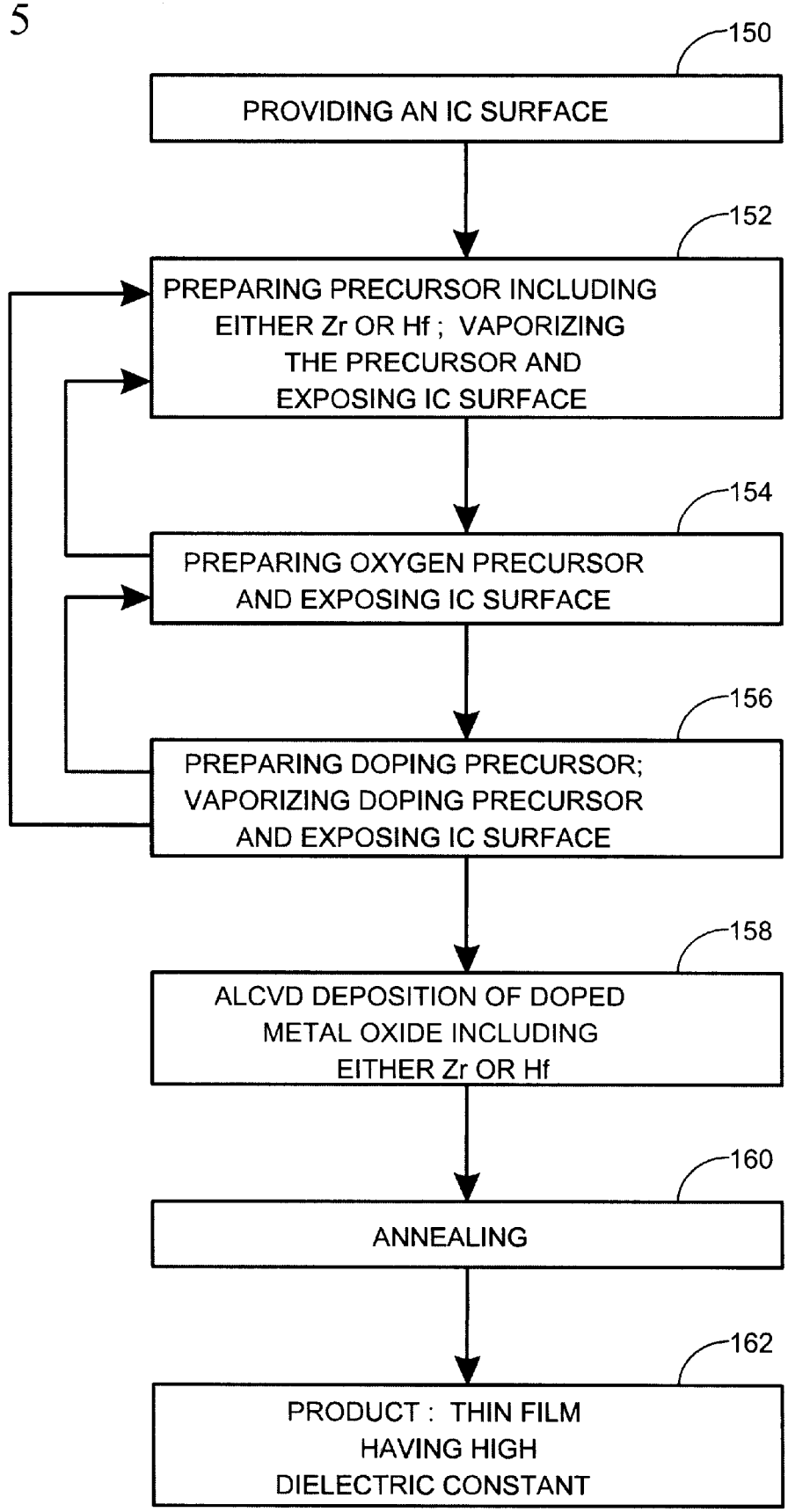
FIG. 5 is a flowchart illustrating steps in a ALCVD method of forming a doped metal oxide film of the present invention.

The present invention investigates doped zirconium oxide. Submicron PMOSFETs have been fabricated with the Zr—O gate dielectrics with excellent characteristics. In short, it was discovered that doping a $ZrO_2$ film, with a divalent, or trivalent, doping metal, results in the ability to control the electrical properties of the film, especially the electron affinity.

The present invention is a thin film having a high dielectric constant, with respect to silicon dioxide, which comprises a divalent, or trivalent, doping metal, a metal selected from the group consisting of zirconium (Zr) and hafnium (Hf), and oxygen. The doping metal is preferably a trivalent metal, such as aluminum (Al), scandium (Sc), lanthanum (La), or yttrium (Y), or a divalent metal, such as calcium (Ca) or strontium (Sr).

In several useful applications, the thin film typically has a thickness in the range of approximately 20 and 200 Å, a dielectric constant in the range of approximately 10 to 25.

The percentage of doping metal in the film, typically does not exceed approximately 50%.

FIG. 1 is a flowchart illustrating a sputter deposition method for the doped metal oxide film of the present invention. Step 10 provides an integrated circuit (IC) having a surface. Step 12 establishes an atmosphere including oxygen. Typically, Step 12 includes the atmosphere also comprising argon (Ar), with the ratio of $O_2$ to Ar being in the range of approximately 5 to 25%. The pressure is in the range of approximately 1 to 10 millitorr (mT). Step 14 sputters at least one target metal including a metal selected from the group consisting of Zr and Hf on the IC surface. Step 14 also sputters the doping metal on the IC surface. The doping metal is preferably a trivalent metal, such as aluminum (Al), scandium (Sc), lanthanum (La), or yttrium (Y), or a divalent metal, such as calcium (Ca) or strontium (Sr). In some aspects of the invention, Step 14 includes co-sputtering with separate targets including a first target of a metal selected from the group consisting of Zr and Hf, and a second target including the doping metal.

Step 16, in response to Steps 12 and 14, forms the doped metal oxide film. Step 18 anneals at a temperature in the range of approximately 400 and 900 degrees C. The annealing time varies in the range of approximately 10 seconds to 30 minutes, depending on the annealing temperature. Step 18 includes establishing an atmosphere including elements selected from the group consisting of Ar, $N_2$, $N_2:H_2$ forming gas, $O_2$, $H_2O$, $N_2O$, NO, no gas (gas-free environment), and oxygen plasma. Step 20 is a product, where a thin film having a high dielectric constant and good insulation properties is formed.

In some aspects of the invention, wherein Step 10 provides a silicon IC surface, a further step precedes Step 16. Step 14a (not shown) establishes an IC silicon surface temperature in the range of approximately room temperature and 400 degrees C.

Zr—Al—O and Hf—Al—O films were prepared by co-sputtering as described above. The sputtering power ratio was adjusted to vary the amount of Al concentration in zirconium oxide.

The dielectric film of the present invention is applicable to gate dielectrics, storage capacitors, and other applications such as one transistor (1T) ferroelectric memory. The dielectric film produced according to the method of the present invention may have wide applicability wherever high-k dielectric materials will be used.

FIGS. 2 and 3 illustrate steps in a completed MOSFET transistor made using the doped metal oxide film of the present invention. FIG. 2 illustrates transistor 50 having a channel region 52 with a top surface 54. Overlying channel region 52 is a gate dielectric film 56.

In some aspects of the invention, transistor 50 further comprises an interface barrier 62 having a thickness 64 in the range of approximately 2 to 5 Å, interposed between channel region 52 and gate dielectric film 56. Interface barrier 62 is comprised of materials selected from the group consisting of silicon nitride and silicon oxynitride, whereby channel region top surface 54 is made smoother to increase the electron mobility of MOSFET 50.

FIG. 3 illustrates gate dielectric film 56 interposed between gate electrode 58 and channel region top surface 54. Gate dielectric film 56 has a high dielectric constant relative to silicon dioxide, and includes a metal selected from the group consisting of zirconium (Zr) and hafnium (Hf), and oxygen. Gate dielectric film 56 includes a doping metal. The doping metal is preferably a trivalent metal, such as aluminum (Al), scandium (Sc), lanthanum (La), or yttrium (Y), or a divalent metal, such as calcium (Ca) or strontium (Sr). The percentage of doping metal, in film 56 is in the range of approximately 0 to 50%. Preferably, the percentage of Al in film 56 is approximately 25%. Gate dielectric film 56 has a thickness 60 (FIG. 3) in the range of approximately 20 and 200 Å. Gate dielectric film 56 has a dielectric constant in the range of approximately 10 to 25.

In the case of gate dielectrics in bulk CMOS device applications, the wafers are processed using any state of the art conventional method, such as isolation, followed by P-well and N-well formation to expose the channel region. An ultra-thin layer of oxidation barrier may still be needed. In this case, possible barriers include silicon nitride and silicon oxynitride. Next, the high-k dielectric is deposited. There are several ways of preparing the film:
  A. Co-sputtering of Zr and the doping metal in inert or oxidizing ambient;
  B. Co-sputtering compound targets, such as Zr—Al, in inert or oxidizing ambient;
  C. Chemical vapor deposition of Zr—Al—O and Hf—Al—O; or
  D. Evaporation.

Following deposition, the film is annealed in inert (e.g., Ar, $N_2$, $N_2:H_2$ forming gas) and/or oxidizing ($O^2$, $H_2O$, $N_2O$, NO, and no gases (gas-free) ambient atmosphere at an elevated temperature (400–900° C.) to condition the high k-film and the high-k/Si interface. However, if the film is deposited by evaporation, the annealing process typically includes oxygen, to include oxygen in the alloy film.

Following annealing, a gate is deposited and patterned into a gate stack. The gate material could be metal or polysilicon. Then, using any state of the art device fabrication process, the device is completed by the conventional method, or a gate replacement method using nitride, polysilicon, or poly SiGe dummy gate.

FIG. 4 is a flowchart illustrating steps in a CVD method of forming a doped metal oxide film of the present invention. Step 100 provides an integrated circuit (IC) having a surface. Step 102 prepares at least one precursor including a metal selected from the group consisting of Zr and Hf, and the doping metal. Step 102 includes the doping metal. The doping metal is preferably a trivalent metal, such as aluminum (Al), scandium (Sc), lanthanum (La), or yttrium (Y), or a divalent metal, such as calcium (Ca) or strontium (Sr). In some aspects of the invention, step 102 comprises a first precursor including a metal selected from the group consisting of Zr and Hf, and a second precursor including the doping metal metal. Step 104 vaporizes at least one precursor. Step 106 establishes an atmosphere including oxygen. Typically, step 106 includes the atmosphere comprising argon (Ar), with the ratio of $O_2$ to Ar being in the range of approximately 5 to 25%, and the pressure being in the range of approximately 1 to 10 T. Step 108 decomposes the precursor on the IC surface to deposit, by chemical vapor deposition (CVD), an alloy film including the metal selected from the group consisting of Zr and Hf, the doping metal, and oxygen.

Step 110 anneals at a temperature in the range of approximately 400 to 800 degrees C. Step 110 includes establishing an atmosphere including elements selected from the group consisting of Ar, $N_2$, $N_2:H_2$ forming gas, $O_2$, $H_2O$, $N_2O$, NO, no gas, and oxygen plasma. Step 112 is a product, where a thin film having a high dielectric constant and good barrier properties is formed.

In some aspects of the invention, Step 100 provides a silicon IC surface, and a further step precedes Step 108. Step 106a establishes an IC silicon surface temperature in the range of approximately 300 and 500 degrees C.

In another embodiment of the present invention, atomic layer chemical vapor deposition (ALCVD) is used to form the doped metal oxide dielectric layer. ALCVD employs a chemical phenomenon known as chemisorption. In chemisorption, a material in a gas phase will adsorb to a surface saturating it, forming a monolayer. Most conventional deposition techniques employ physisorption processes, which produce multilayer deposition regions with a surface coverage that is purely statistical. By taking advantage of chemisorption, films can be grown that are extremely uniform in thickness and composition. For instance, zirconium oxide films have reportedly been grown this way on silicon by using zirconium chloride ($ZrCl_4$) to form the first monolayer, purging the system of $ZrCl_4$, and then exposing the surface to water vapor ($H_2O$). Other precursors for producing zirconium oxide layers include zirconium propoxide ($Zr(iOPr)_4$) and zirconium tetramethyl heptanedionato ($Zr(tmhd)_4$). Chemisorption occurs over a very limited range of temperature and pressures for a given gas-solid combination. Typically the temperature will be between 100 and 700 degrees C. at a pressure of between 1 and 1000 mTorr. For example, zirconium oxide has reportedly been deposited on silicon substrates at a temperature of 300 degrees Celsius using $ZrCl_4$ and $H_2O$. As the process produces a monolayer, thicker layers of zirconium oxide would be produced by adding additional monolayers. A doping precursor may be used to deposit a layer of doping metal. ALCVD is also commonly referred to as pulsed CVD. This is because the methodology typically relies on a pulse of precursor material to control the amount of material to be deposited. Typically the pulse will contain enough material to coat an IC surface. In another embodiment of the present method, the pulse of doping precursor is introduced that is less than that required to form a monolayer over the entire IC surface. The general processes will need to be optimized, without undue experimentation, to utilize chemisorption in connection with selected precursors. The critical aspects of this deposition scheme are sufficient purging from one component prior to introduction of the next component, and the ability to control the temperature and pressure. Atomic layer deposition makes it possible to produce layers of less than 10 angstroms thick, and preferably layers between approximately 2 and 5 angstroms thick. An efficient tool for preparing such ultrathin, atomic layers depositions on semiconductor substrates does not currently exist, although experimental depositions have demonstrated that atomic layer deposition is workable.

FIG. 5 is a flowchart illustrating the steps in an ALCVD method of forming a doped metal oxide film.

Step 150 provides an integrated circuit (IC) having a surface. In a preferred embodiment, the surface native oxide on the surface is desorbed to provide a bare silicon surface.

Step 152 prepares at least one precursor including a metal selected from the group consisting of Zr and Hf, vaporizes the at least one precursor, and exposes the IC surface to the at least one precursor. The precursor should be suitable for depositing a monolayer of material on an IC surface in an ALCVD chamber. For example, in a preferred embodiment zirconium chloride ($ZrCl_4$), zirconium propoxide ($Zr(iOPr)_4$) and zirconium tetramethyl heptanedionato ($Zr(tmhd)_4$)is the precursor for depositing Zr, whereby Zr adsorbs to the IC surface forming a monolayer.

Step 154 prepares an oxygen precursor and exposing the IC surface to the oxygen precursor. Preferably the oxygen precursor will be a vapor. For example, in a preferred embodiment, $H_2O$ is used as the oxygen precursor.

Step 156 prepares a doping precursor including a doping metal. The doping metal is preferably a trivalent metal, such as aluminum (Al), scandium (Sc), lanthanum (La), or yttrium (Y), or a divalent metal, such as calcium (Ca) or strontium (Sr). In a preferred embodiment, the doping precursor is selected from the group consisting of $AlCl_3$, $Al(CH_3)_3$, and $Al(acac)_3$, for aluminum doping. The IC surface is exposed to the doping precursor, whereby a layer, or partial layer, of doping metal is adsorbed onto the IC surface.

Step 158 refers to the result of successive steps and repetitions of steps 152, 154 and 156 as necessary to produce the desired dielectric material. As can is denoted by the arrows to the left, steps 152, 154 and 156 may need to be repeated individually or in varying sequences to produce the desired dielectric material. The requirement for repetition is in large part due to the monolayer deposition associated with ALCVD. As is well known in the art of ALCVD, each precursor is preferably exhausted between successive layers, even if the same precursor is used for the subsequent layer. The precursors should be preferably be pulsed with sufficient material to produce a monolayer of material over the IC surface.

Step 160 following deposition the dielectric material is annealed to finally condition the dielectric material and the interface with the underlying material.

Step 162 refers to the final high dielectric constant film.

Although step 152 and 156 are shown as distinct steps, in another embodiment of the present invention, the two precursors could be introduced simultaneously.

FIG. 6 is a flowchart illustrating steps in an evaporation method of forming a doped metal oxide film. Step 200 provides an integrated circuit (IC) having a silicon surface. Step 202 prepares at least one crucible including the metal selected from the group consisting of Zr and Hf, and the doping metal. The doping metal is preferably a trivalent metal, such as aluminum (Al), scandium (Sc), lanthanum (La), or yttrium (Y), or a divalent metal, such as calcium (Ca) or strontium (Sr). Step 204 establishes a vacuum (gas-free) atmosphere. Step 206 heats the at least one crucible to a crucible temperature in the range of approximately 1000 and 2000 degrees C., to evaporate the metals prepared in Step 202. Step 208, in response to steps 202 through 206, deposits an alloy film including the metal selected from the group consisting of Zr and Hf, and the doping metal. Step 210 anneals in an atmosphere including oxygen at a temperature in the range of approximately 400 to 800 degrees C. to form an alloy film including the metal selected from the group consisting of Zr and Hf, the doping metal, and oxygen. Step 210 includes establishing an atmosphere including elements selected from the group consisting of Ar, $N_2$, $N_2$:$H_2$ forming gas, $O_2$, $H_2O$, $N_2O$, NO, no gas, and oxygen plasma. Step 212 is a product, where a thin film having a high dielectric constant and good barrier properties is formed.

In some aspects of the invention, step 202 includes a first crucible for the metal selected from the group of Zr and Hf, and a second crucible for the doping metal. Then, Step 206 includes heating the first crucible to a temperature in the range of approximately 1000 and 2000 degrees C., and heating the second crucible to a temperature in the range of approximately 1000 and 2000 degrees C. The Zr/Hf crucible need not be the same temperature as the doping metal crucible.

In some aspects of the invention, Step 210 includes sub-steps (not shown). Step 210a anneals in an atmosphere including oxygen at a temperature in the range of approximately 400 and 900 degrees C. Step 210b anneals in an atmosphere including elements selected from the group consisting of Ar, $N_2$, $N_2$:$H_2$ forming gas, $O_2$, $H_2O$, $N_2O$, NO, no gas, and oxygen plasma, at a temperature in the range of approximately 400 and 900 degrees C. A high-k dielectric film has been disclosed along with several methods of making same. The electron affinity, electron barrier height, and hole barrier height, of the dielectric film can be modified by including a doping metal. The doping metal is preferably a trivalent metal, such as aluminum (Al), scandium (Sc), lanthanum (La), or yttrium (Y), or a divalent metal, such as calcium (Ca) or strontium (Sr).

In a preferred embodiment, the high-k dielectric film remains amorphous at relatively high annealing temperatures. Because the film does not form a crystalline structure, interfaces to adjacent films have fewer irregularities. When used as a gate dielectric, the film can be made thick enough to provide the capacitance required to couple the gate electric field into the channel regions, while the surface of the channel region can be made smooth to support high electron mobility. The film is formed through CVD, ALCVD, sputtering, or evaporation deposition methods. Other variations and embodiments of the present invention will likely occur to others skilled in the art.

Although certain embodiments have been described above, the scope of the invention is by no means limited to the disclosed embodiments. Reasonable changes and new improvements to the invention may be made in the future, and yet still within the scope of this invention. This invention is defined by the claims.

What is claimed is:

1. A thin film having a high dielectric constant, with respect to silicon dioxide, comprising:
   a) a doping metal;
   b) a metal selected from the group consisting of zirconium (Zr) and hafnium (Hf); and
   c) oxygen, whereby a high dielectric film is formed.

2. The thin film as in claim 1 in which the doping metal is a trivalent metal selected from the group consisting of aluminum (Al), scandium (Sc), lanthanum (La), and yttrium (Y).

3. The thin film as in claim 1 in which the doping metal is a divalent metal selected from the group consisting of calcium (Ca), and strontium (Sr).

4. The thin film as in claim 1 in which the thin film has a thickness in the range of approximately 20 and 200 Å.

5. The thin film as in claim 1 in which the thin film has a dielectric constant in the range of approximately 10 to 25.

6. The thin film as in claim 1 in which the percentage of doping metal in the film does not exceed approximately 50%.

7. The thin film as in claim 6 in which the percentage of doping metal in the film is approximately 25%.

8. A MOSFET transistor comprising:
   a) a gate electrode;
   b) a channel region having a top surface underlying said gate electrode; and
   c) a gate dielectric film interposed between said gate electrode and said channel region top surface, having a high dielectric constant relative to silicon dioxide, including a metal selected from the group consisting of zirconium (Zr) and hafnium (Hf), and including oxygen, and further including a doping metal.

9. The transistor as in claim 8 in which the doping metal includes a trivalent metal selected from the group consisting of aluminum (Al), scandium (Sc), lanthanum (La), and yttrium (Y).

10. The transistor as in claim 8 in which the doping metal includes a divalent metal selected from the group consisting of calcium (Ca) and strontium (Sr).

11. The transistor as in claim 8 in which the percentage of doping metal in the film is in the range of approximately 0 to 50%.

12. The transistor as in claim 11 in which the percentage of doping metal in the film is approximately 25%.

13. The transistor as in claim 8 in which said gate dielectric film has a thickness in the range of approximately 20 and 200 Å.

14. The transistor as in claim 8 in which said gate dielectric film has a dielectric constant in the range of approximately 10 to 25.

15. The transistor as in claim 8 further comprising an interface barrier having a thickness in the range of approximately 2 to 5 Å, interposed between said channel region and said gate dielectric film, said interface barrier including materials selected from the group consisting of silicon nitride and silicon oxynitride, whereby said channel region top surface is smoother to increase the electron mobility of the MOSFET.

16. In the fabrication of an integrated circuit (IC) having a surface, a method of forming a doped metal oxide film on the IC surface comprising the steps of:
   a) establishing an atmosphere including oxygen;
   b) sputtering at least one target metal including a metal selected from the group consisting of Zr and Hf, and including a doping metal on the IC silicon surface;
   c) in response to Steps a) and b), forming the doped metal oxide film; and
   d) annealing at a temperature in the range of approximately 400 and 900 degrees C., whereby a thin film having a high dielectric constant and good barrier properties is formed.

17. The method as in claim 16 wherein the IC surface is maintained in a temperature range of between approximately room temperature and 400 degrees C.

18. The method as in claim 16 in which Step a) includes the atmosphere including argon (Ar), in which the ratio of $O_2$ to Ar is in the range of approximately 5 to 25%, and in which the pressure is in the range of approximately 1 to 10 millitorr (mT).

19. The method as in claim 16 in which Step d) includes establishing an atmosphere including elements selected from the group consisting of Ar, $N_2$, $N_2$:$H_2$ forming gas, $O_2$, $H_2O$, $N_2O$, NO, no gas, and oxygen plasma.

20. The method as in claim 16, wherein the doping metal is a trivalent metal selected from the group consisting of aluminum (Al), scandium (Sc), and lanthanum (La).

21. The method as in claim 16, wherein the doping metal is a divalent metal selected from the group consisting of calcium (Ca), and strontium (Sr).

22. The method as in claim 16 in which Step b) includes co-sputtering with separate targets including a first target of a metal selected from the group consisting of Zr and Hf, and a second target including a trivalent metal.

23. The method as in claim 16 in which Step b) includes co-sputtering with separate targets including a first target of a metal selected from the group consisting of Zr and Hf, and a second target including a divalent metal.

24. In the fabrication of an integrated circuit (IC) having a surface, a method of forming a doped metal oxide film comprising the steps of:
   a) preparing at least one precursor including a metal selected from the group consisting of Zr and Hf, and a doping metal;
   b) vaporizing the at least one precursor;
   c) establishing an atmosphere including oxygen;
   d) decomposing the precursor on the IC surface to deposit, by chemical vapor deposition (CVD), an alloy film including a metal selected from the group consisting of Zr and Hf, a doping metal, and oxygen; and
   e) annealing at a temperature in the range of approximately 400 to 900 degrees C., whereby a thin film having a high dielectric constant and good barrier properties is formed.

25. The method as in claim 24 further comprising establishing an IC surface temperature in the range of between approximately 300 and 500 degrees C. prior to step d).

26. The method as in claim 24 in which Step c) includes the atmosphere including argon (Ar), in which the ratio of $O_2$ to Ar is in the range of approximately 5 to 25%, and in which the pressure is in the range of approximately 1 to 10 torr (T).

27. The method as in claim 24 in which Step e) includes establishing an atmosphere including elements selected from the group consisting of Ar, $N_2$, $N_2$:$H_2$ forming gas, $O_2$, $H_2O$, $N_2O$, NO, no gas, and oxygen plasma.

28. The method as in claim 24 in which the doping metal is a trivalent metal selected from the group consisting of aluminum (Al), scandium (Sc), and lanthanum (La).

29. The method as in claim 24 in which the doping metal is a divalent metal selected from the group consisting of calcium (Ca), and strontium (Sr).

30. In the fabrication of an integrated circuit (IC) having a surface, a method of forming a doped metal oxide film comprising the steps of:
   a) preparing a first precursor including a metal selected from the group consisting of Zr and Hf;
   b) vaporizing the first precursor and exposing the IC surface to the precursor, whereby a layer of the metal is chemically adsorbed to the surface to deposit, by ALCVD, the layer of metal;
   c) preparing an oxygen precursor;
   d) vaporizing the oxygen precursor and exposing the IC surface to the oxygen precursor, whereby a layer of oxygen is chemically adsorbed to the surface to deposit, by ALCVD, the layer of oxygen;
   e) preparing a doping metal precursor, which includes a doping metal;
   f) vaporizing the doping metal precursor and exposing the IC surface to the doping metal precursor, whereby a layer of the doping metal is chemically adsorbed to the surface to deposit, by ALCVD, the layer of doping metal; and
   g) annealing at a temperature in the range of approximately 300 to 900 degrees C. to condition the deposited layers, whereby a thin film having a high dielectric constant and good barrier properties is formed.

31. The method as in claim 30 further comprising establishing an IC silicon surface temperature in the range of between approximately 100 and 700 degrees C. during processing.

32. The method as in claim 30 in which the doping metal is a trivalent metal selected from the group consisting of aluminum (Al), scandium (Sc), and lanthanum (La).

33. The method as in claim 30 in which the doping metal is a divalent metal selected from the group consisting of calcium (Ca), and strontium (Sr).

34. The method as in claim 30 in which the first precursor is $ZrCl_4$.

35. The method as in claim 30 in which the oxygen precursor is $H_2O$.

36. The method as in claim 30 in which the doping metal precursor is a precursor selected from the group consisting of $AlCl_3$, $Al(CH_3)_3$, and $Al(acac)_3$.

37. In the fabrication of an integrated circuit (IC) having a silicon surface, a method of forming a doped metal oxide film comprising the steps of:
   a) preparing at least one crucible including a metal selected from the group consisting of Zr and Hf, and a doping metal;
   b) establishing a vacuum atmosphere;
   c) heating the at least one crucible to a crucible temperature in the range of approximately 1000 and 2000 degrees C., to evaporate the metals prepared in Step a);
   d) in response to Steps a) through c), depositing an alloy film including a metal selected from the group consisting of Zr and Hf, and the doping metal; and
   e) annealing in an atmosphere including oxygen at a temperature in the range of approximately 400 to 900 degrees C. to form an alloy film including the metal selected from the group consisting of Zr and Hf, the doping metal, and oxygen, whereby a thin film having a high dielectric constant and good barrier properties is formed.

38. The method as in claim 37 in which Step a) includes a first crucible for the metal selected from the group of Zr and Hf, and a second crucible for the doping metal, and in which Step c) includes heating the first crucible to a temperature in the range of approximately 1000 and 2000 degrees C., and heating the second crucible to a temperature in the range of approximately 1000 and 2000 degrees C.

39. The method as in claim 38 in which the doping metal is a trivalent metal selected from the group consisting of aluminum (Al), scandium (Sc), and lanthanum (La).

40. The method as in claim 38 in which the doping metal is a divalent metal selected from the group consisting of calcium (Ca), and strontium (Sr).

41. The method as in claim 37 in which Step e) includes establishing an atmosphere including elements selected from the group consisting of Ar, $N_2$, $N_2$:$H_2$ forming gas, $O_2$, $H_2O$, $N_2O$, NO, no gas, and oxygen plasma.

* * * * *